United States Patent [19]
Prein

[11] Patent Number: 6,136,677
[45] Date of Patent: *Oct. 24, 2000

[54] METHOD OF FABRICATING SEMICONDUCTOR CHIPS WITH SILICIDE AND IMPLANTED JUNCTIONS

[75] Inventor: Frank Prein, Glen Allen, Va.

[73] Assignee: Siemens Aktiengesellschaft, Munich, Germany

[*] Notice: This patent issued on a continued prosecution application filed under 37 CFR 1.53(d), and is subject to the twenty year patent term provisions of 35 U.S.C. 154(a)(2).

[21] Appl. No.: 08/937,781

[22] Filed: Sep. 25, 1997

[51] Int. Cl.⁷ ............... H01L 21/3205; H01L 21/324; H01L 21/44; H01L 21/4763
[52] U.S. Cl. ............... 438/592; 438/597; 438/648; 438/649; 438/651; 438/655; 438/656; 438/663; 438/664; 438/682; 438/683; 438/685; 257/368; 257/382; 257/383; 257/384; 257/389; 257/390
[58] Field of Search .................. 438/592, 655; 357/23.5, 321, 69; 365/185; 29/571

[56] References Cited

U.S. PATENT DOCUMENTS

| | | | |
|---|---|---|---|
| 4,145,803 | 3/1979 | Tasch, Jr. ................. | 29/571 |
| 4,443,930 | 4/1984 | Hwang et al. ............. | 29/571 |
| 4,561,170 | 12/1985 | Doering et al. ............ | 29/571 |
| 4,814,854 | 3/1989 | Tigelaar et al. ............ | 357/67 |
| 4,868,133 | 9/1989 | Huber ........................ | 437/10 |
| 4,870,470 | 9/1989 | Bass, Jr. et al. ........... | 357/23.5 |
| 5,060,195 | 10/1991 | Gill et al. .................. | 365/185 |
| 5,394,002 | 2/1995 | Peterson ..................... | 257/321 |
| 5,425,392 | 6/1995 | Thakur et al. .............. | 438/592 |
| 5,453,389 | 9/1995 | Strain et al. ................ | 437/31 |
| 5,455,205 | 10/1995 | Umimoto et al. ........... | 437/240 |
| 5,459,353 | 10/1995 | Kanazawa .................. | 257/751 |
| 5,462,898 | 10/1995 | Chen et al. ................. | 437/235 |
| 5,472,887 | 12/1995 | Hutter et al. ............... | 437/34 |
| 5,514,908 | 5/1996 | Liao et al. .................. | 257/751 |
| 5,536,676 | 7/1996 | Cheng et al. ............... | 437/162 |
| 5,550,090 | 8/1996 | Ristic et al. ................ | 437/228 |
| 5,571,744 | 11/1996 | Demirlioglu et al. ....... | 437/57 |
| 5,584,964 | 12/1996 | Umimoto et al. ........... | 156/657.1 |
| 5,597,756 | 1/1997 | Fazan et al. ................ | 437/52 |
| 5,600,598 | 2/1997 | Skjaveland et al. ........ | 365/189.11 |
| 5,605,854 | 2/1997 | Yoo ............................ | 437/44 |
| 5,606,189 | 2/1997 | Adan ......................... | 257/303 |
| 5,622,882 | 4/1997 | Yee ............................ | 438/210 |
| 5,624,867 | 4/1997 | Cheng et al. ............... | 438/560 |
| 5,710,438 | 1/1998 | Oda et al. .................. | 257/69 |
| 5,851,921 | 12/1998 | Gardner et al. ............ | 438/655 |
| 5,899,735 | 5/1999 | Tseng ........................ | 438/592 |

FOREIGN PATENT DOCUMENTS 0 747 960 A2  12/1996  European Pat. Off. .

OTHER PUBLICATIONS

Patent Abstract of Japan, Publication No. 05190811, dated Jul. 30, 1993.
Patent Abstract of Japan, Publication No. 05190809, dated Jul. 30, 1993.

Primary Examiner—Tom Thomas
Assistant Examiner—Bernard E. Souw
Attorney, Agent, or Firm—Stanton C. Braden

[57] ABSTRACT

A method of fabricating a semiconductor device includes the steps of providing a semiconductor chip (10) with a memory area (22) and a logic area (26). The memory area (22) and the logic area (26) each have gate structures (50) formed therein. The step of sequentially forming silicided junctions (44) in the logic area (26) and implanted junctions in the memory area (26) is also included.

8 Claims, 4 Drawing Sheets

METHOD OF FABRICATING SEMICONDUCTOR CHIPS WITH SILICIDE AND IMPLANTED JUNCTIONS

BACKGROUND

1. Technical Field

This disclosure relates to semiconductor chips and more particularly, to a method for creating silicided junctions and implanted junctions on the same semiconductor chip.

2. Description of the Related Art

Embedded memory chips have increasingly become more vital to high technology components. Embedded memory chips such as embedded dynamic random access memory (DRAM), refer to semiconductor chips that include logic circuits with memory arrays "embedded" therein. Embedded DRAM chips improve data transfer rates as well as increase bandwidth for the chip. Embedded DRAM chips have many applications in multimedia and communications.

Although embedded DRAM chips are desirable they are relatively more difficult to manufacture. Logic circuits generally require silicided junctions while memory arrays utilize implanted junctions. These two types of junctions are created using two different processes that are somewhat difficult to incorporate into a single process sequence. For example, the higher reaction temperatures needed to form the silicided junctions can present problems with respect to the integrity of the implanted junctions. Further, the silicide process and the implant process must be integrated without unduly complicating the process sequence or unduly increasing the number of thermal cycles required for the overall process. Ion implanted junctions are formed by bombarding the silicon surface with dopant ions. Ion implanted junctions do not have low sheet resistance as do silicided junctions. However, ion implanted junctions have controlled subsurface depth dopant concentrations.

Silicided junctions are formed in order to reduce sheet resistance over the semiconductor junction. A refractory metal is deposited on the surface of the semiconductor chip over a layer containing silicon. The refractory metal, for example, titanium or cobalt is reacted with the underlying layer containing silicon to form a silicide. The silicide formation at the silicon surface is determined by the metal silicon interface. The deposition of a highly pure metal and a clean surface are required for the silicide reaction. Any residues or contaminants lead to non-uniform silicide layers.

Therefore, a need exists for a semiconductor device in which silicided junctions and implanted junctions can be formed on the same semiconductor chip in a single process sequence.

SUMMARY

A method of fabricating a semiconductor device comprising the steps of providing a semiconductor chip with a memory area and a logic area, each having gate structures formed therein, and sequentially forming silicided junctions in the logic area and implanted junctions in the memory area.

In particular, one method of fabricating a semiconductor device includes the steps of providing a semiconductor chip with a memory area and a logic area, etching a first dielectric layer to remove the first dielectric layer from the logic area and to pattern the first dielectric layer in the memory area, etching a second dielectric layer disposed beneath the first dielectric layer in both the memory area and the logic area to form gate structures and expose a gate oxide layer containing silicon below the second dielectric layer, depositing a spacer layer on the memory area and the logic area removing the spacer layer from the logic area, depositing a layer of refractory metal on the memory area and the logic area, the refractory metal being in contact with the exposed area of the gate oxide layer, annealing the layer of refractory metal to form a metal silicide with the exposed area of the gate oxide layer and removing the refractory metal layer and the spacer layer.

Embodiments of the invention include the first dielectric layer being silicon nitride and the second dielectric layer being polycrystalline silicon. The refractory metal layer may be titanium or cobalt and the metal silicide is a compound based on the metal used. A transition region may be introduced that separates the logic area and the memory area and the step of reserving a transition area between the logic area and the memory area set aside a separation for the logic area from the memory area by between 0.3 $\mu$m and 0.5 $\mu$m. Further, a portion of the spacer layer may remain disposed laterally on the gate structures for protection of the gate structures during implantation.

BRIEF DESCRIPTION OF DRAWINGS

Various embodiments will be described in detail in the following description of preferred embodiments with reference to the following figures wherein.

DETAILED DESCRIPTION OF PREFERRED EMBODIMENTS

The present invention relates to an integrated circuit (IC) and the formation thereof. In particular, the invention relates to an IC that comprises both silicided and ion implanted junctions. Such IC, for example, includes a merged memory-logic circuit such as a embedded DRAM-logic, a RAM, a DRAM (DRAM), a synchronous DRAM (SDRAM), or a static RAM (SRAM). The IC can also be a logic device such as a programmable logic array (PLA) or an application specific ICs (ASIC), or any circuit device.

Typically, numerous ICs are fabricated on a semiconductor substrate, such as a silicon wafer, in parallel. After processing, the wafer is diced in order to separate the ICs into a plurality of individual chips. The chips are then packaged into final products for use in, for example, consumer products such as computer systems, cellular phones, personal digital assistants (PDAs), and other electronic products.

In accordance with one embodiment of the invention, the IC comprises an embedded DRAM-logic device. The silicided junctions for employed for logic circuit components and implanted junctions are employed for memory array components. The invention provides for the formation of silicided and implanted junctions in a single process sequence, which can be used to form both types of junctions on a single chip.

Figure 1:
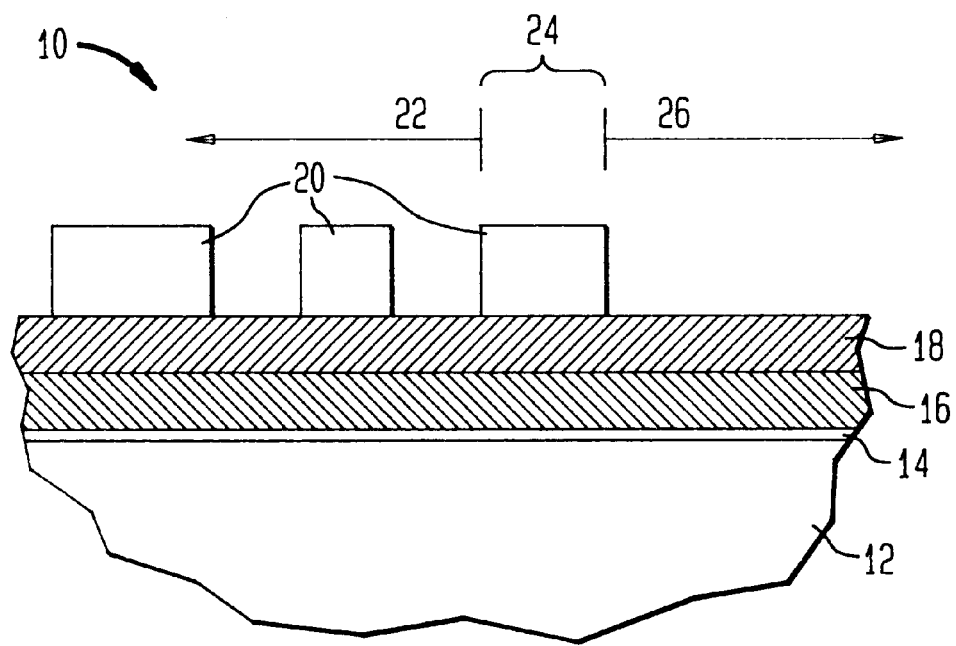
FIG. 1 shows a cross sectioned view of a semiconductor chip having a resist mask formed on a first dielectric layer.

Referring now in specific detail to the drawings in which like reference numerals identify similar or identical elements throughout the several views, and initially to FIG. 1, a semiconductor chip 10 is formed from a silicon substrate 12. The substrate, for example, comprises a silicon wafer. Other semiconductor substrates such as gallium arsenide, germanium, silicon on insulator (SOI), or other semiconductor materials are also useful. The substrate, for example, may be lightly or heavily doped with dopants of a pre-determined conductivity to achieve the desired electrical characteristics. The substrate may comprises device features (not shown) formed in a portion thereof, such as trench capacitors used in memory cells.

As shown, a gate oxide layer 14 is formed on silicon substrate 12. A layer of polycrystalline silicon 16 is formed on gate oxide layer 14 and a layer of dielectric material 18, such as, for example, silicon nitride is formed on layer of polycrystalline silicon 16. A resist mask 20 is placed at desired locations in a predetermined pattern in a memory array area 22 to protect masked regions from etching in later processing steps. A transition area 24 is needed to isolate memory array area 22 from a logic area 26. Layer of silicon nitride 18 is not needed in a logic area 26 and therefore no resist is applied. Since transition region 24 is used for isolation between memory array 22 and logic area 26, the silicon nitride layer 18 is desirably maintained for processing in later steps. Hence, resist mask 20 is applied to transition region 24. Transition region 24 separates logic area 26 from memory array 22 by a distance of, for example, between 0.3 $\mu$m and 0.5 $\mu$m.

Resist mask 20 is patterned in memory array 22 to form transistor gates. The layer of silicon nitride 18 is removed in areas of the surface absent of resist mask 20 using any suitable technique known to those skilled in the art such as, for example, dry etching. The exact conditions used in the dry etch process will depend on a number of factors. In one embodiment, the dry etching step includes exposing the surface of semiconductor chip 10 to $CF_4$, $CHF_3$ or Ar gas. This process exposes layer of polycrystalline silicon 16 in the areas absent resist mask 20. Silicon nitride layer 18 is also removed from logic area 26 by this etching process. Resist mask 20 is removed after etching.

Figure 2:
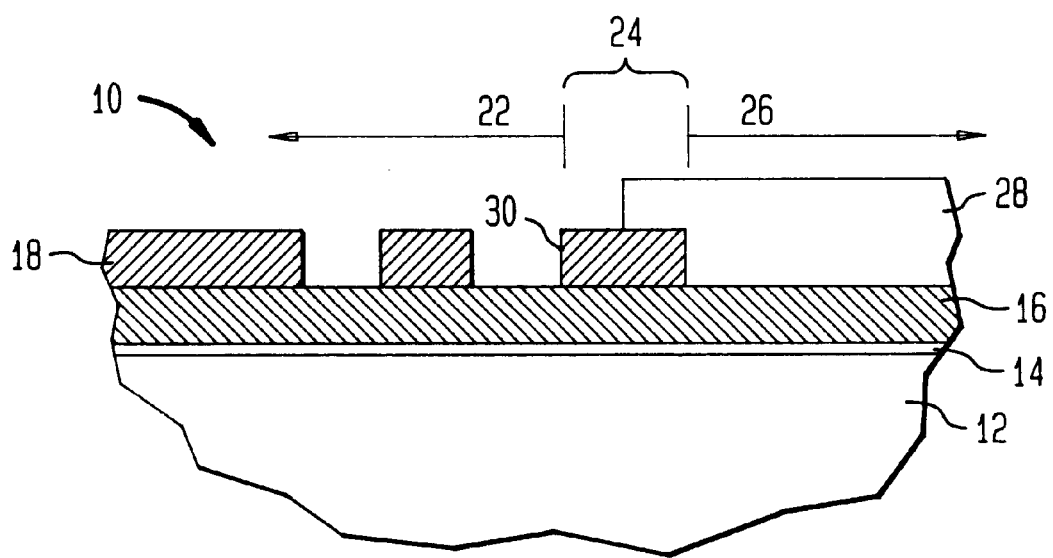
FIG. 2 shows a cross sectioned view of a semiconductor chip after etching a first dielectric layer and after developing a resist mask over a logic area.

Referring to FIG. 2, transition area 24 now includes a silicon nitride cap 30 which separates memory array 22 from logic area 26. The exposed areas of polycrystalline silicon layer 16 are to be etched. A resist mask 28 is applied to logic area 26 to protect polycrystalline silicon layer 18. Silicon nitride layer 18 acts as a mask to protect polycrystalline silicon layer 16 in memory array 22. Any suitable technique known to those skilled in the art can be used to remove polycrystalline silicon layer 16 in memory array 22 in those areas absent silicon nitride layer 18. In one embodiment, a dry etching is employed. As with the previous etching step, the exact parameters employed during the etch will depend on a number of factors such as, for example, the thickness of layer 16 and the nature of the masking materials. Typically, however, the dry etching process utilizes HCl gas. Resist mask 28 is removed after etching. After etching of the poly layer, ion implantation is performed to create doped regions within substrate 12 to form implanted junctions in memory array 22. The implant is self aligned because the nitride cap layer 18 and resist 28 serve as an implant mask. Dopants include, for example, arsenic, boron, or phosphorus.

Figure 3:
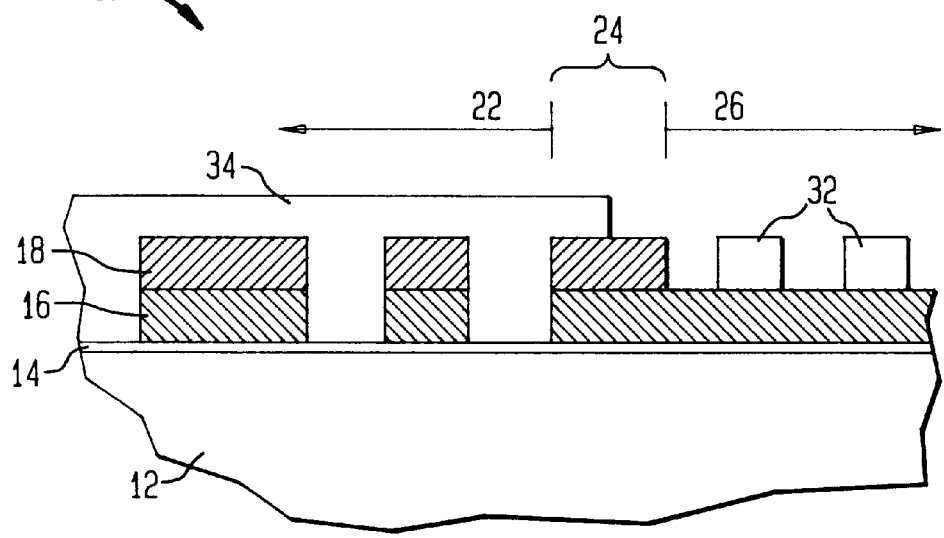
FIG. 3 shows a cross sectioned view of a semiconductor chip after etching a second dielectric layer and after developing a resist mask over a logic area and a memory area.

Referring to FIG. 3, a resist mask 32 is applied in a desired pattern to logic area 26. Memory array 22 is protected by resist mask 34 to prevent further etching of the polycrystalline silicon layer 16 during the removal of the unmasked portion of layer 16 in the logic area 26. Again, any suitable technique known to those skilled in the art can be utilized to remove the unmasked portion of polycrystalline silicon layer 16 where dry etching is used. Typical etching techniques include using HCl gas. Polycrystalline silicon layer 16 is removed to expose gate oxide layer 14 in logic area 26. Resist mask 32 and resist mask 34 are removed subsequent to etching.

Figure 4:
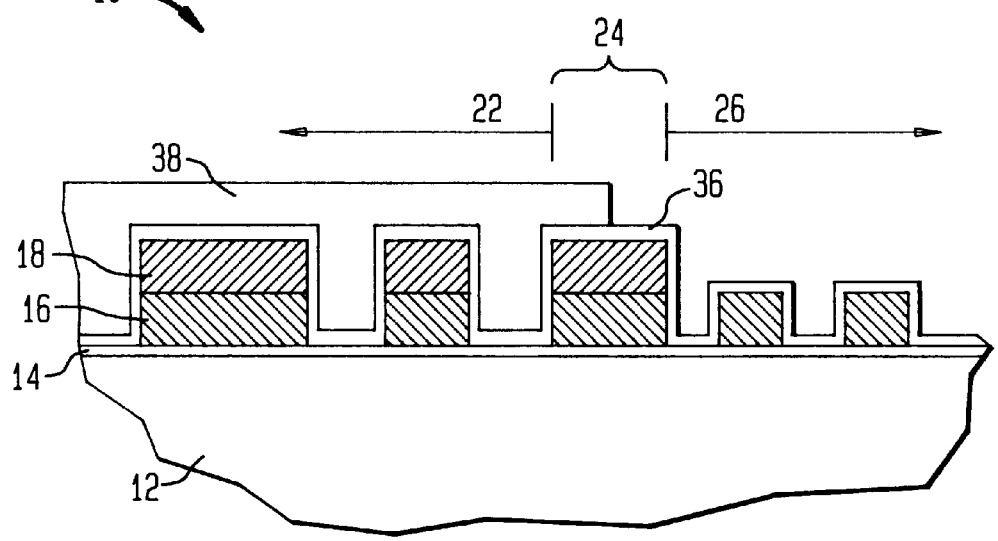
FIG. 4 shows a cross sectioned view of a semiconductor chip after etching a first dielectric layer and after developing a resist mask over a logic area.

Referring to FIG. 4, a spacer layer 36 is deposited over semiconductor chip 10. Memory array 22, transition region 24 and logic area 26 are covered by spacer layer 36. Spacer layer 36 can be made from any dielectric material such as, for example, silicon nitride. Spacer layer 36 is typically applied using chemical vapor deposition (CVD) or low pressure chemical vapor deposition (LPCVD). A resist mask 38 is developed on memory array 22 which prepares spacer layer 36 to be removed from logic area 26.

Figure 5:
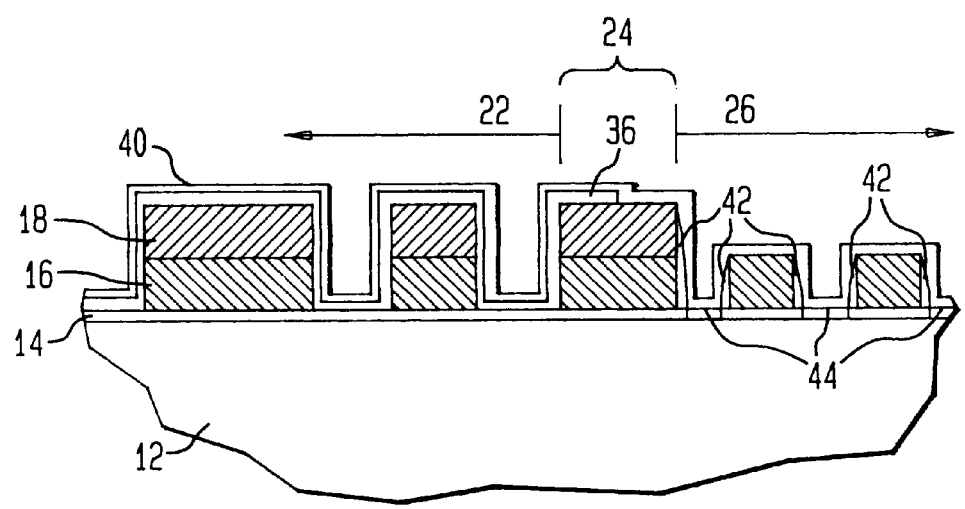
FIG. 5 shows a cross sectioned view of a semiconductor chip after depositing a refractory metal layer after a spacer layer was removed from a logic area.

Referring to FIG. 5, spacer layer 36 is etched away from logic area 26 using any suitable technique, such as the previously used process for silicon nitride etching using a resist to mask the array region. A byproduct of the etching process leaves spacers 42 formed laterally on dielectric layers. Logic area 26 has spacers formed laterally on the remaining portions of polycrystalline silicon layer 16, and transition region 24 adjacent to logic area 26 has spacer 42 formed laterally on both polycrystalline silicon layer 16 and silicon nitride layer 18. A refractory metal layer 40 is deposited over the entire surface of semiconductor chip 10. Refractory metal layer 40 may be made for example from titanium or cobalt. Other refractory metals are also useful.

Deposition of refractory metal layer 40 is within the purview of one skilled in the art. Thus, for example, refractory metal layer 40 may be sputtered or epitaxially grown on the surface of semiconductor chip 10. Since spacer layer 36 is etched away in logic area 26, gate oxide layer 14 is exposed in regions 44. When refractory metal layer 40 is deposited, it is in contact with gate oxide layer 14. Gate oxide layer 14 is comprised of a silicon-containing compound, such as silicon dioxide which will react with refractory metal layer 40.

Semiconductor chip 10 is subjected to rapid thermal annealing (RTA). This process consists of heating semiconductor chip 10 to between 750 and 900 degrees C. Inert gas such as helium or argon is introduced to aid in the prevention of surface reactions on the surface of semiconductor chip 10. RTA causes refractory metal layer 40 to react with gate oxide layer 14 to form silicided junctions in region 44. Silicided junctions 44 may have titanium silicide, for example, therein. After RTA, refractory metal layer 40 is removed using known techniques. Where the refractory metal layer 40 is cobalt or titanium, a wet etching process using nitric acid can be used to dissolve and remove refractory metal layer 40.

Figure 6:
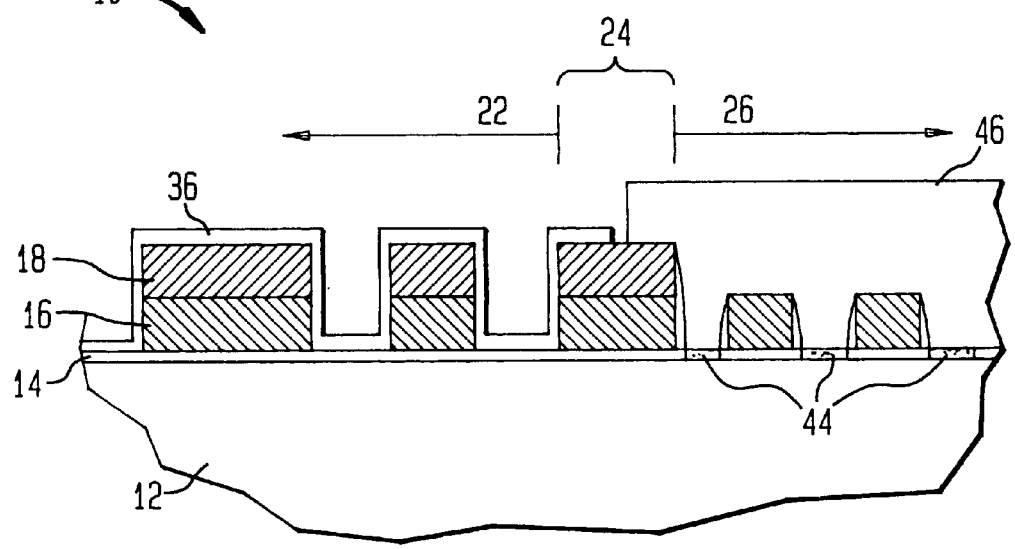
FIG. 6 shows a cross sectioned view of a semiconductor chip after a metal silicide is formed.

Referring to FIG. 6, spacer layer 36 is removed from memory array 22. Prior to etching spacer layer 36, a resist mask 46 is developed in logic area 26 to protect that region from the etching process to follow. A dry etching process can be used similar to the dry etching process used in the description of FIG. 5 to remove spacer layer 36 from memory array 22. Silicided junctions 44 are shown through gate oxide layer 14.

Figure 7:
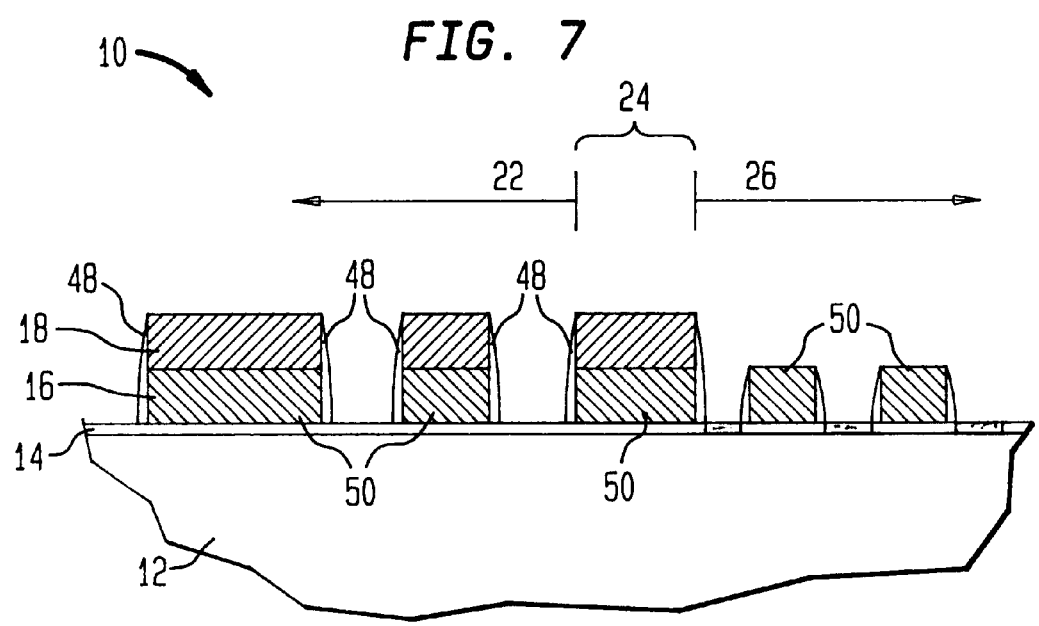
FIG. 7 shows a cross sectioned view of a semiconductor chip ready for further processing and having both silicided and implanted junctions on a single semiconductor chip.

Referring now to FIG. 7, spacer layer 36 as described in FIG. 6 is etched away, but leaves spacers 48 laterally disposed on silicon nitride layer 18 and polycrystalline silicon layer 16. Gate structures 50 include the raised dielectric portions remaining on semiconductor chip 10. Spacers 48 aide in protecting these gate structures 50 during later implantation processes.

The process described herein provides a semiconductor chip 10 with both a memory array 22 and logic area 26, including both silicided and implanted junctions manufactured into the same semiconductor chip 10.

It is also contemplated that further processing of the chip can be performed. Such further processing includes, for example, ion implantation to dope the regions adjacent to gate structures 50 to form diffusion areas. Ion implantation processes are carried out to increase the doping in junction areas between gate structures 50. Ion implantation includes p-doping and n-doping. Areas to be p-doped are masked during n-doping, and n-doped areas are masked during p-doping. Barrier deposition is completed on diffusion areas to serve as a diffusion barrier for contact metals which are subsequently deposited. Barrier deposition also provides a conductive path through diffusion area to contacts. Later, a passivation layer (not shown) can be deposited over the surface of semiconductor chip 10. The passivation layer is preferably formed from borophosphosilicate glass (BPSG). Contact openings (not shown) can subsequently be formed in this passivation layer.

Having described embodiments of a novel for a semiconductor chip having implanted and silicided junctions in a single process sequence (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as defined by the appended claims. Having thus described the invention with the details and particularity required by the patent laws, what is claimed and desired protected by letters patent is set forth in the appended claims.

What is claimed is:

1. A method of fabricating an embedded DRAM device including a logic section and a memory section, comprising the steps of:

providing a substrate with a memory area and a logic area separated by a predetermined distance;

etching a layer of silicon nitride to remove silicon nitride from the logic area and to pattern the silicon nitride in the memory area;

etching a layer of polycrystalline silicon disposed beneath the layer of silicon nitride in both the memory area and the logic area to form gate structures and expose a gate oxide layer below the polycrystalline silicon layer;

implanting dopant ions in the memory area adjacent to the gate structures;

depositing a silicon nitride spacer layer on the memory area and the logic area;

removing the spacer layer from the logic area;

depositing a layer of titanium on the memory area and the logic area, the titanium being in contact with the exposed area of the gate oxide layer in between the gate structures;

annealing the titanium layer to form titanium salicide forming silicided junctions between the gate structures in the logic area by reacting the titanium with the gate oxide between the gate structures;

removing the titanium layer and the spacer layer thereby providing silicided junctions in the logic area and implanted junctions in the memory area in a single process sequence.

2. The method as recited in claim 1 further comprising the step of maintaining a transition region between the logic area and the memory area.

3. The method as recited in claim 2 wherein the transition region separates the logic area from the memory area by between 0.3 and 0.5 $\mu$m.

4. The method as recited in claim 1 wherein a portion of the spacer layer remains disposed laterally on the gate structures.

5. A method of fabricating an embedded DRAM device including a logic section and a memory section, comprising the steps of:

providing a semiconductor chip with a memory area, a logic area and a transition region disposed between the logic area and the memory area;

etching a layer of silicon nitride to remove the silicon nitride from the logic area and to pattern the silicon nitride in the memory area;

etching a layer of polycrystalline silicon disposed beneath the layer of silicon nitride in both the memory area and the logic area to form gate structures and expose a gate oxide layer below the polycrystalline silicon layer;

implanting dopant ions in the memory area adjacent to the gate structures;

depositing a silicon nitride spacer layer on the memory area and the logic area;

removing the spacer layer from the logic area;

depositing a layer of titanium on the memory area and the logic area, the titanium being in contact with the exposed area of the gate oxide layer in between the gate structures;

annealing the titanium layer to form titanium salicide forming silicided junction between the gate structures in the logic area by reacting the titanium with the gate oxide between the gate structures; and removing the titanium layer and the spacer layer thereby providing silicided junctions in the logic area and implanted junctions in the memory area in a single process sequence.

6. The method as recited in claim 5 further comprising the step of maintaining a transition region between the logic area and the memory area.

7. The method as recited in claim 6 wherein the transition region separates the logic area from the memory area by between 0.3 and 0.5 $\mu$m.

8. The method as recited in claim 5 wherein a portion of the spacer layer remains disposed laterally on the gate structures.

* * * * *